(12) United States Patent
Hu

(10) Patent No.: US 7,046,029 B2
(45) Date of Patent: *May 16, 2006

(54) CONDUCTIVE MATERIAL FOR INTEGRATED CIRCUIT FABRICATION

(75) Inventor: Yungjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/108,603

(22) Filed: Apr. 18, 2005

(65) Prior Publication Data

US 2005/0225340 A1 Oct. 13, 2005

Related U.S. Application Data

(60) Continuation of application No. 10/835,014, filed on Apr. 29, 2004, now Pat. No. 6,906,547, which is a division of application No. 10/428,703, filed on May 2, 2003, now Pat. No. 6,765,398, which is a division of application No. 09/815,964, filed on Mar. 23, 2001, now Pat. No. 6,646,456, which is a division of application No. 09/286,787, filed on Apr. 6, 1999, now Pat. No. 6,329,670.

(51) Int. Cl.
*G01R 31/26* (2006.01)

(52) U.S. Cl. .................................. 324/765

(58) Field of Classification Search ................ 324/754, 324/761, 762, 757, 765, 158.1, 763; 438/14–18; 257/48

See application file for complete search history.

(56) References Cited

U.S. PATENT DOCUMENTS 4,696,851 A   9/1987   Pryor
4,761,386 A   8/1988   Buynoski
4,823,182 A   4/1989   Okumura
4,884,123 A   11/1989  Dixit et al.
4,895,770 A   1/1990   Schintlmeister et al.
4,920,071 A   4/1990   Thomas
5,225,771 A * 7/1993   Leedy ........................ 324/757
5,248,903 A   9/1993   Heim (Continued)

FOREIGN PATENT DOCUMENTS

EP   0854 505 A2   1/1998

OTHER PUBLICATIONS

Baker, et al., "Combined X-Ray Photoelectron/auger Electron Spectroscopy/Glaning Angle X-Ray diffraction/Extended X-Ray Absorbtion Fine Structure Investigation of TiBxNy Coatings". J. Vac. Sci. Technol., A 15(2), pp. 284-291, Mar./Apr. 1997.

(Continued)

*Primary Examiner*—Jermele Hollington
*Assistant Examiner*—Tung X. Nguyen
(74) *Attorney, Agent, or Firm*—Knobbe Martens Olson & Bear LLP

(57) ABSTRACT

A conductive composition of titanium boronitride ($TiB_xN_y$) is disclosed for use as a conductive material. The titanium boronitride is used as conductive material in the testing and fabrication of integrated circuits. For example, the titanium boronitride is used to construct contact pads such as inline pads, backend pads, sensors, or probes. Advantages of embodiments of the titanium boronitride include reduced scratching, increased hardness, finer granularity, thermal stability, good adhesion, and low bulk resistivity. Exemplary methods of creating the titanium boronitride include a sputtering process and a plasma anneal process.

20 Claims, 5 Drawing Sheets

U.S. PATENT DOCUMENTS

| | | |
|---|---|---|
| 5,298,333 A * | 3/1994 | Maixner et al. ............ 428/472 |
| 5,364,803 A | 11/1994 | Lur et al. |
| 5,391,516 A | 2/1995 | Wojnarowski et al. |
| 5,441,904 A | 8/1995 | Kim et al. |
| 5,486,492 A | 1/1996 | Yamamoto et al. |
| 5,506,499 A | 4/1996 | Puar |
| 5,541,427 A | 7/1996 | Chappell et al. |
| 5,593,903 A | 1/1997 | Beckenbaugh et al. |
| 5,668,394 A | 9/1997 | Lur et al. |
| 5,684,304 A | 11/1997 | Smears |
| 5,693,377 A | 12/1997 | Westmoreland et al. |
| 5,720,098 A | 2/1998 | Kister |
| 5,742,174 A | 4/1998 | Kister et al. |
| 5,837,598 A | 11/1998 | Aronowitz et al. |
| 5,851,680 A | 12/1998 | Heau |
| 5,920,081 A | 7/1999 | Chen et al. |
| 5,962,867 A | 10/1999 | Liu |
| 5,968,594 A | 10/1999 | Hu et al. |
| 5,994,716 A | 11/1999 | Ikeya et al. |
| 6,017,818 A | 1/2000 | Lu |
| 6,028,360 A | 2/2000 | Nakamura et al. |
| 6,069,482 A | 5/2000 | Hilton |
| 6,133,582 A | 10/2000 | Osann, Jr. et al. |
| 6,200,649 B1 | 3/2001 | Dearnaley |
| 6,251,190 B1 | 6/2001 | Mak et al. |
| 6,284,646 B1 | 9/2001 | Leem |

OTHER PUBLICATIONS

Sade, et al., "Characterization of TiB2/TiSi2 Bilayer Structure Deposited By Sputtering", Mat. Res. Soc. Smp. Proc., vol. 402, pp. 131-136, 1996.

* cited by examiner

CONDUCTIVE MATERIAL FOR INTEGRATED CIRCUIT FABRICATION

This application is a continuation of U.S. application Ser. No. 10/835,014, filed on Apr. 29, 2004, now U.S. Pat. No. 6,906,547, which is a divisional of U.S. application Ser. No. 10/428,703, filed on May 2, 2003, now U.S. Pat. No. 6,765,398, which is a divisional of U.S. application Ser. No. 09/815,964, filed on Mar. 23, 2001, now U.S. Pat. No. 6,646,456, which is a divisional of U.S. application Ser. No. 09/286,787, filed on Apr. 6, 1999, now U.S. Pat. No. 6,329,670, the entirety of which are hereby incorporated herein by reference.

BACKGROUND OF THE INVENTION

1. Field of the Invention

The present invention relates in general to conductive material, and more particularly to contact pads for the fabrication of semiconductor devices and circuits.

2. Background

During the fabrication process of a semiconductor device, a manufacturer typically performs tests at various stages of the process to ensure that the device is functioning properly. While these tests are being performed, sensors or probes are usually brought into contact with pads on the surface of the semiconductor device. Unfortunately, bringing probes into contact with the pads frequently scratches the pads.

These scratches can contaminate the fabrication environment by introducing particles of the pad material into the environment. Furthermore, the scratches can reduce the reliability of further testing by damaging the contact area between the probes and the pads. If the fabrication environment becomes contaminated or the testing procedures become unreliable, then the fabrication process may yield devices that do not function properly.

To function properly, conventional pads exhibit certain properties, such as low resistivity and good adhesion to the semiconductor substrate. Unfortunately, materials having these properties usually lack sufficient hardness to resist scratching when brought into contact with test probes. Conversely, materials having sufficient hardness to resist scratching generally exhibit high resistivity or poor adhesion to the semiconductor substrate.

SUMMARY OF THE INVENTION

A conductive composition of titanium boronitride ($TiB_xN_y$) is disclosed for use as a conductive material. For example, the titanium boronitride is used to construct contact pads such as inline pads or backend pads. The titanium boronitride can also be used to construct sensors such as probes. Advantages of embodiments of the titanium boronitride include reduced scratching, increased hardness, finer granularity, thermal stability, good adhesion, and low bulk resistivity. Exemplary methods of creating the titanium boronitride include a sputtering process and a plasma anneal process.

In one embodiment of the invention, a test pad comprises a first metal layer and a first dielectric layer above the metal layer. The test pad further comprises a plug in the first dielectric layer, the plug in communication with the metal layer, and a $TiB_xN_y$ layer above the first dielectric layer, the $TiB_xN_y$ layer in communication with the plug.

In another embodiment, a test pad comprises a substrate and a first dielectric layer on the substrate, the first dielectric layer having a via to the substrate. The test pad further comprises a $TiB_xN_y$ layer in at least a portion of the via, the $TiB_xN_y$ layer in communication with the substrate.

In another embodiment, an integrated circuit comprises a $TiB_xN_y$ conductor. In yet another embodiment, a contact pad comprises $TiB_xN_y$. In still another embodiment, a sensor comprises a $TiB_xN_y$ surface. In yet another embodiment, a testing system comprises test circuitry, a probe in communication with the test circuitry, and a test pad in communication with the probe, wherein at least a portion of the test pad comprises $TiB_xN_y$. In an additional embodiment, a testing system comprises test circuitry and a sensor in communication with the test circuitry, wherein at least a portion of the sensor comprises $TiB_xN_y$.

In one embodiment, a method comprises connecting a $TiB_xN_y$ surface of a sensor to a contact on a semiconductor device. In another embodiment, a method comprises of contacting a sensor to a $TiB_xN_y$ surface on a contact pad.

In another embodiment, a method of forming an integrated circuit comprises depositing $TiB_xN_y$ on a substrate. In yet another embodiment, a method of forming a conductive element in an integrated circuit comprises forming a plurality of devices in a semiconductor substrate. The method also comprises interconnecting the devices to form a circuit having a plurality of circuit nodes. The method further comprises depositing a pad layer in electrical contact with at least one of the circuit nodes. The pad layer comprises at least boron and nitrogen.

In another embodiment, a test pad comprises a substrate, a metal layer and a first dielectric layer above, the metal layer. The test pad further comprises a plug in the first dielectric layer, the plug in communication with the metal layer. The test pad also comprises an aluminum layer in communication with the plug wherein the aluminum layer is above the plug. In addition, the test pad comprises a $TiB_xN_y$ layer in communication with the aluminum layer wherein the $TiB_xN_y$ layer is above the aluminum layer. The $TiB_xN_y$ has an x-factor between about 0.5 and 2 and a y-factor between about 0.2 and 2. The test pad further comprises a second dielectric layer above the $TiB_xN_y$ layer wherein the second dielectric layer is etched to expose the $TiB_xN_y$ layer.

BRIEF DESCRIPTION OF THE DRAWINGS

These and other aspects, advantages, and novel features of the invention will become apparent upon reading the following detailed description and upon reference to the accompanying drawings.

DETAILED DESCRIPTION OF THE PREFERRED EMBODIMENTS

The present invention relates to a novel conductive material that can be used in a variety of ways to improve integrated circuit manufacturing or testing. In one embodiment, the novel conductive material is titanium boronitride ($TiB_xN_y$) that is used to form a test pad layer with increased resistance to scratching. Advantageously, the titanium boronitride is resistant to surface scratching. Although embodiments of the conductive material are described herein with reference to contact pads, the use of the conductive material is not so limited. Indeed, the material can be used in a variety of other contexts in which it is desirable to provide conductive material with attributes such as hardness, small granularity, low resistivity, or good adhesion.

Figure 1:
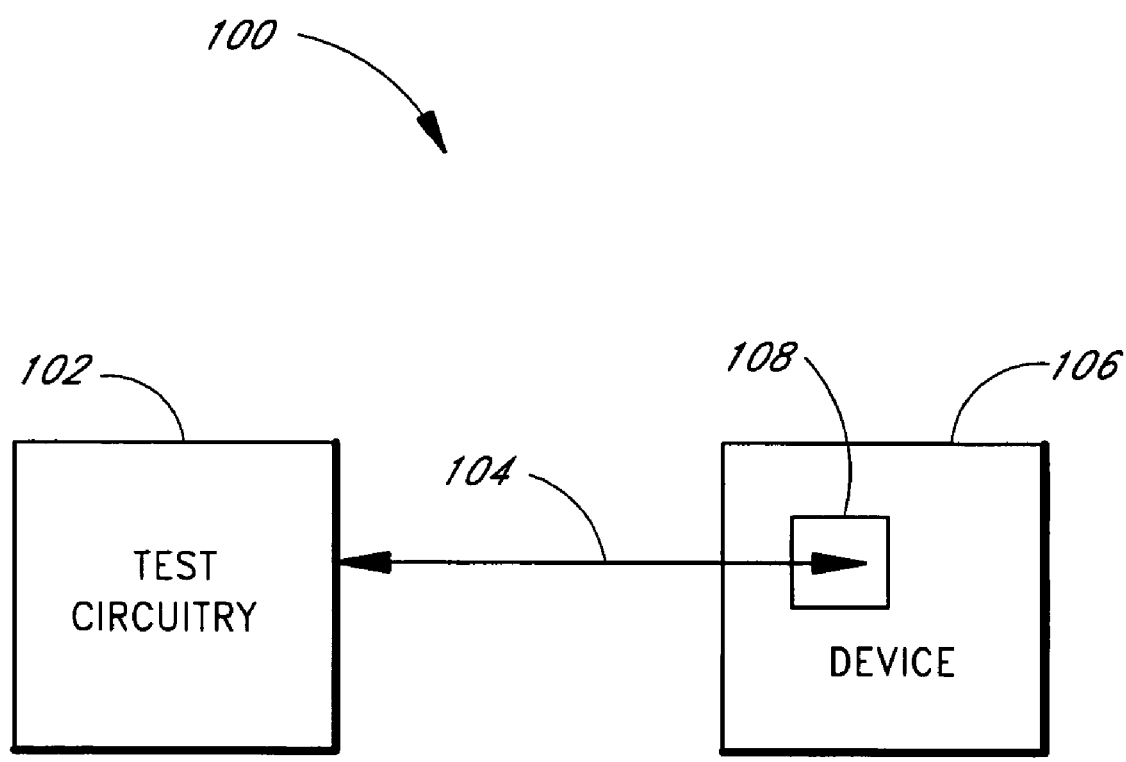
FIG. 1 is a block diagram of a testing machine and a semiconductor device.

FIG. 1 is a block diagram of a testing system 100. The testing system 100 includes test circuitry 102, a sensor 104 and a device 106 with a novel contact pad 108. The sensor 104 interconnects the test circuitry 102 with the contact pad 108. For example, in many semiconductor test procedures, the sensor 104 contacts the contact pad 108 in the device 106. The sensor 104 may be repeatedly removed and reconnected to the contact pad 108 so as to allow the test circuitry 102 to conduct different types of tests or different tests at various manufacturing stages.

The test circuitry 102 can include a wide variety of data acquisition and test equipment. For example, the test circuitry 102 may include devices that conduct calibration and parametric tests of semiconductors to measure voltage parameters, current parameters, leakage, output drive, or capacitance. The test circuitry 102 can also be configured to perform tests during an integrated circuit fabrication process. In addition, the test circuitry 102 can be configured to perform backend testing including burn-in, environmental testing and packaging testing. By way of example, embodiments of the test circuitry 102 include multimeters, temperature measurement devices, thermometers, voltmeters, voltage detectors, current detectors, ohmmeters, electrometers, source meters, test interface devices, and the like. Furthermore, the test circuitry 102 can include a wide range of data acquisition devices.

The sensor 104 includes any component that contacts the contact points 108 on the device 106. In some embodiments, the sensor 104 is a test probe. By way of example, commercial providers of test probes include Keithley Instruments, Accuprobe, Advanced Probing Systems, Cerprobe, Probot, Cascade, Microtech, Signatone, The Micromanipulator Company, TMT, Inc., Advanced Probing Systems, Credence Systems, Electroglas, ETEC Integrated Technology, Novtek Test Systems, Pacific Western Systems, Temptronic, and Trio-Tech International to name a few. While the sensor 104 will hereinafter be referred to as the probe 104, it is understood that the sensor 104 is not limited to probes and can be any sensor that obtains information about the device 106.

The device 106 can be any device that is tested via a conductive connection. In one embodiment, the device 106 is an integrated circuit. In another embodiment, the device 106 is a semiconductor structure. Furthermore, the device 106 may be a die, printed circuit board, packaged integrated circuit, a semiconductor memory, a processor, digital processing circuitry, or the like. In some embodiments, the device 106 will include a contact point 108 as described in further detail below.

For example, in one embodiment, the device 106 is a processor that has a contact pad 108. The contact pad 108 comprises a layer of titanium boronitride. The titanium boronitride conductor can be used to test the processor during the fabrication, after fabrication, when the processor is in communication with at least one conductor, etc. In another embodiment, the titanium boronitride may be used for other conductive purposes within the device 106.

Figure 2:
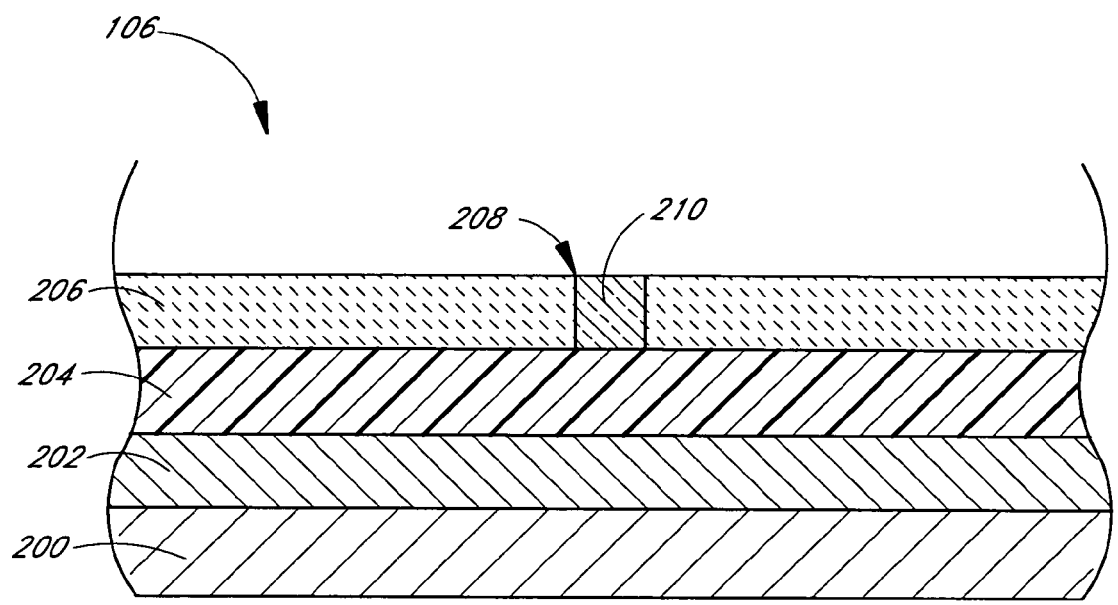
FIG. 2 is a cross-sectional view of a semiconductor device in accordance with one embodiment of the present invention.

FIG. 2 illustrates an exemplary device 106. In one embodiment, the device 106 comprises a substrate 200, a metal layer 202, a titanium nitride layer 204, and an inter-level dielectric (ILD) layer 206. The substrate 200 is a semiconductor substrate with one or more semiconductor layers or structures. While the illustrated layer of the substrate 200 comprises an intrinsically doped monocrystalline silicon wafer, the skilled artisan will understand that the substrate 200 in other arrangements can comprise other forms of materials including semiconductor layers that include active or operable portions of semiconductor devices.

For example, in one embodiment, the substrate 200 includes layers for forming dynamic random access memory circuitry. In other embodiments, for example, the substrate 200 may comprise an epitaxially deposited layer of single-crystal silicon. Furthermore, in other embodiments, the substrate 200 may include any circuitry, material, or layers of material that require testing.

The metal layer 202 may comprise any number of possible electrode materials such as aluminum, copper, doped polysilicon, metal suicides and the like. Furthermore, the thickness of the metal layer 202 is sufficiently thick to provide conductivity for a given signal design. In one embodiment, the titanium nitride layer 204 is deposited on the metal layer 202 using conventional techniques. In other embodiments, the titanium nitride layer 204 is optional.

In the illustrated embodiment, the inter-level dielectric layer 206 is deposited on the titanium nitride layer 204. In embodiments that do not have the titanium nitride layer 204, the inter-level dielectric layer 206 is deposited on the metal layer 202. The inter-level dielectric layer 206 preferably comprises oxides such as tetraethyl orthosilicate (TEOS) or boron phosphosilicate glass (BPSG). In other embodiments, the inter-level dielectric layer 206 can be formed by reaction between silane and nitrous oxide or oxygen. The skilled artisan will understand, however, that a variety of materials can be used for the inter-level dielectric layer 206. In one embodiment, the inter-level dielectric layer 206 is 3,500 angstroms (Å). In other embodiment, the inter-level dielectric layer may range from about 4,000 Å to 6,000 Å in thickness.

As shown in FIG. 2, a via 208 is etched through the inter-level dielectric layer 206. The etch process can be performed in a variety of manners. Preferably, the via 208 is "overetched" to ensure that it exposes the underlying titanium nitride layer 204 or metal layer 202 despite any non-uniformities in the thickness of the inter-level dielectric layer 206. In one embodiment, the etch process comprises a plasma etch such as a reactive ion etch (RIE). The skilled artisan will recognize, however, that each of the above noted parameters can be varied significantly and that different etch chemistries can be used, while still obtaining effective etching of the via 208.

The via 208 is filled with conductive material to form a plug 210, typically formed of tungsten, aluminum, metal silicides or polysilicon. For example, the via 208 can be filled using a variety of well-known processes, such as chemical vapor deposition techniques. The chemical vapor deposition techniques can form the plug 210 by filling the via 208 with a conductive material such as tungsten (W), aluminum (Al), metal silicides, or polycrystalline silicon (polysilicon or poly). The conductive material is then etched back using conventional techniques to form the plug 210. Furthermore, the skilled artisan will recognize that a wide range of conductive materials can be used to form the plug 210.

Figure 3:
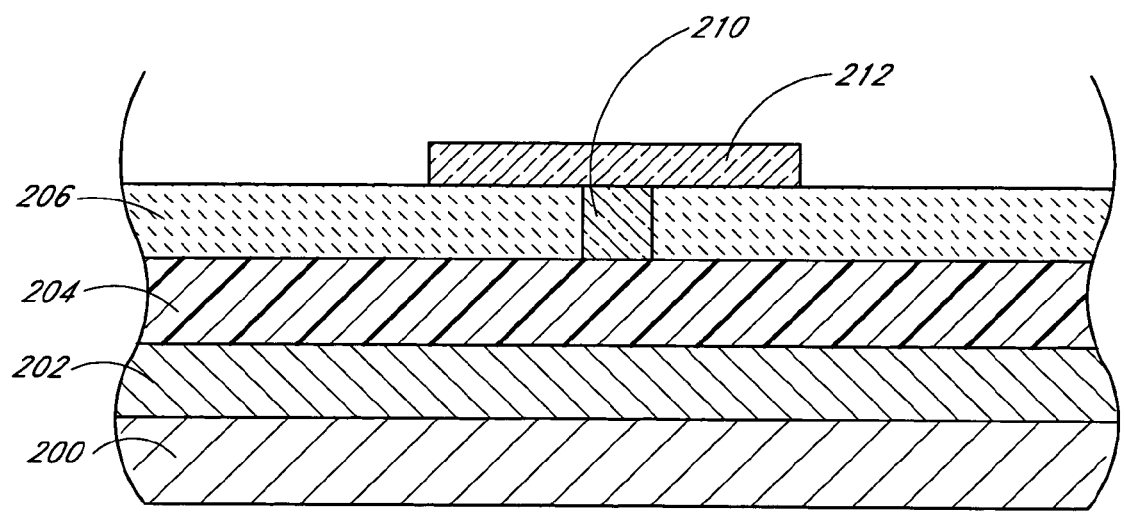
FIG. 3 shows the device of FIG. 2 after the formation of a conductive pad.

In one embodiment, as illustrated in FIG. 3, a conductive pad 212 is formed over at least a portion of the plug 210. The conductive pad 212 is formed using conventional deposition and etching techniques. In one embodiment, the conductive pad 212 is aluminum (Al). The skilled artisan will recognize however that the conductive pad 212 can be formed using a wide variety of conductive materials, such as tungsten (W), metal silicides, or polycrystalline silicon (polysilicon or poly).

Figure 4:
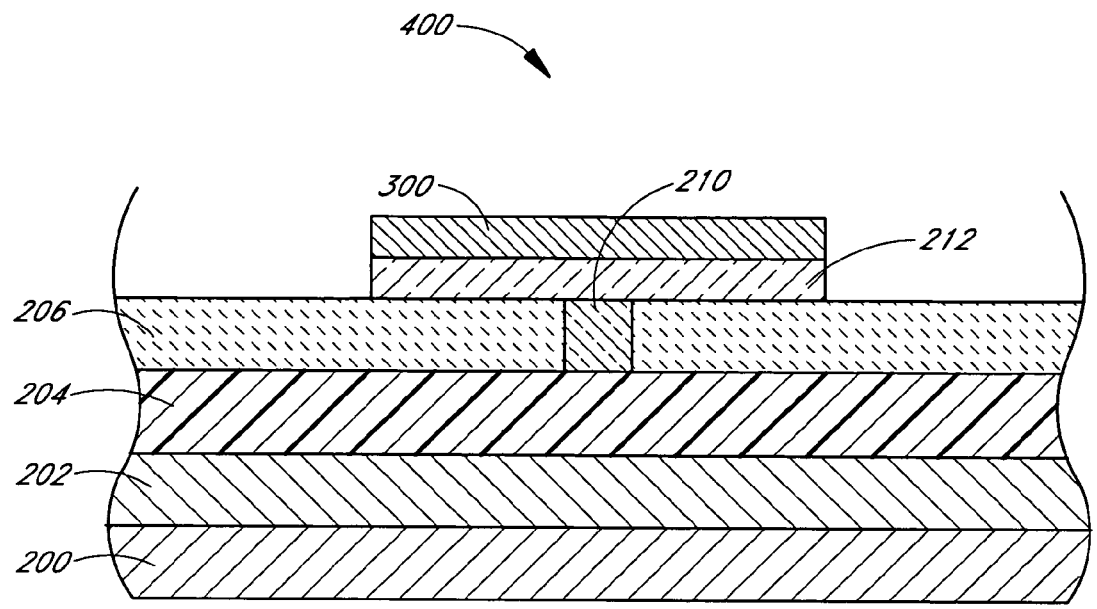
FIG. 4 shows the device of FIG. 3 after the titanium boronitride film has been etched to form an inline pad.

As illustrated in FIG. 4, a titanium boronitride ($TiB_xN_y$) layer 300 is then deposited over at least a portion of the conductive pad 212. In embodiments without the conductive pad 212, the $TiB_xN_y$ layer 300 is deposited over at least a portion of the plug 210. In forming the $TiB_xN_y$ layer 300, any suitable process can be employed wherein the relative boron and nitrogen concentrations are controlled to fall within the desired ranges. For example, the $TiB_xN_y$ layer 300 can be formed by reactively sputtering a titanium boride target in a nitrogen-containing ambient. Titanium boride is commercially available from Tosoh SMD, Inc. of Colorado Springs, Colo. The sputtering plasma comprises a substantially inert gas, preferably argon, and nitrogen ions from a nitrogen source gas, preferably nitrogen ($N_2$) or ammonia ($NH_3$). Suitable sputtering reactors are commercially available from Applied Materials of Santa Clara, Calif. or Tokyo Electron Ltd. of Japan.

The concentration of the nitrogen-containing gas in the sputtering chamber determines the B:N ratio of the $TiB_xN_y$ layer 300. In one embodiment, the concentration of the nitrogen gas in the argon gas is in the range of about 5% to 30%. To achieve a concentration in this range, nitrogen-containing gas can be introduced into the sputtering chamber at a rate of between about 1 standard cubic centimeters per minute (sccm) and 15 sccm while the inert gas is introduced into the sputtering chamber at a rate of between about 30 sccm and 50 sccm. The DC magnetron power of the sputtering reactor is generally set between about 1 kilowatt (kW) and 2 kW, preferably at 1.5 kW. In light of the present disclosure, however, the skilled artisan can readily determine the appropriate sputtering parameters through routine optimization to achieve the desired $TiB_xN_y$ composition in a given reactor configuration.

In another embodiment, the $TiB_xN_y$ layer 300 is formed over at least a portion of the inter-level dielectric layer 206 and the plug 210 using a plasma anneal process. To form the $TiB_xN_y$ layer 300 using a plasma anneal process, a titanium layer is formed above the inter-layer dielectric and the plug 210 using conventional deposition techniques. The titanium layer then undergoes a plasma anneal in an ambient comprising boron-containing gas, preferably diborane ($B_2H_6$), and nitrogen-containing gas, such as ammonia ($NH_3$). The relative concentrations of the boron-containing gas and the nitrogen-containing gas determine the B:N ratio of the $TiB_xN_y$ layer 300.

A suitable plasma reactor is the Centura model commercially available from Applied Materials of Santa Clara, Calif. The RF energy of the preferred plasma reactor is generally set between about 200 watts and 3 kW, more preferably between about 2 kW to 3 kW. The plasma anneal process generally lasts for a period of time ranging from about 5 seconds to 300 seconds. The temperature during the plasma anneal process is generally less than about 450 degrees centigrade to reduce reaction with underlying metal vias or substrates. In light of the present disclosure, however, the skilled artisan can readily determine the appropriate parameters through routine optimization to achieve the desired $TiB_xN_y$ composition in a given plasma reactor configuration.

The sputtering method and the plasma anneal method described above are provided as examples of possible methods that can be employed to form the $TiB_xN_y$ layer 300. Other methods will become apparent to those of ordinary skill in the art in light of the present disclosure.

Both of the methods described above for forming the $TiB_xN_y$ layer 300 have certain unique advantages. For example, the plasma anneal process is particularly advantageous because the titanium preferably used in this process is less expensive than the titanium boride preferably used in the sputtering process. On the other hand, the sputtering process is advantageous because the plasma anneal process preferably includes the use of diborane, which is a relatively unstable compound.

In one embodiment of the present invention, the $TiB_xN_y$ layer 300 resulting from either process described above or any other suitable process has an x-factor in the range of about 0.1 to 10, and more preferably in the range of about 0.5 to 2. Furthermore, the resulting $TiB_xN_y$ layer 300 has a y-factor in the range of about 0.2 to 5, and more preferably in the range of about 0.2 to 2. The B:N ratio of the $TiB_xN_y$ layer 300 controls certain properties of the $TiB_xN_y$ layer 300. For example, as the B:N ratio of the $TiB_xN_y$ layer 300 decreases, the resistivity of the $TiB_xN_y$ layer 300 generally increases.

As illustrated in FIG. 4, the $TiB_xN_y$ layer 300 is then etched using conventional etching techniques to form an inline pad 400. The selective removal of the $TiB_xN_y$ layer 300 may be accomplished by a conventional wet metal etch or cleaning step. The etching can vary to create different inline pads 400 that vary in size to accommodate different test probes. In one embodiment, the inline pad 400 is between about 1,500 Å and 100 kÅ long, between about 1,500 Å and 100 kÅ wide, and between about 100 Å and 1,000 Å thick.

Figure 5:
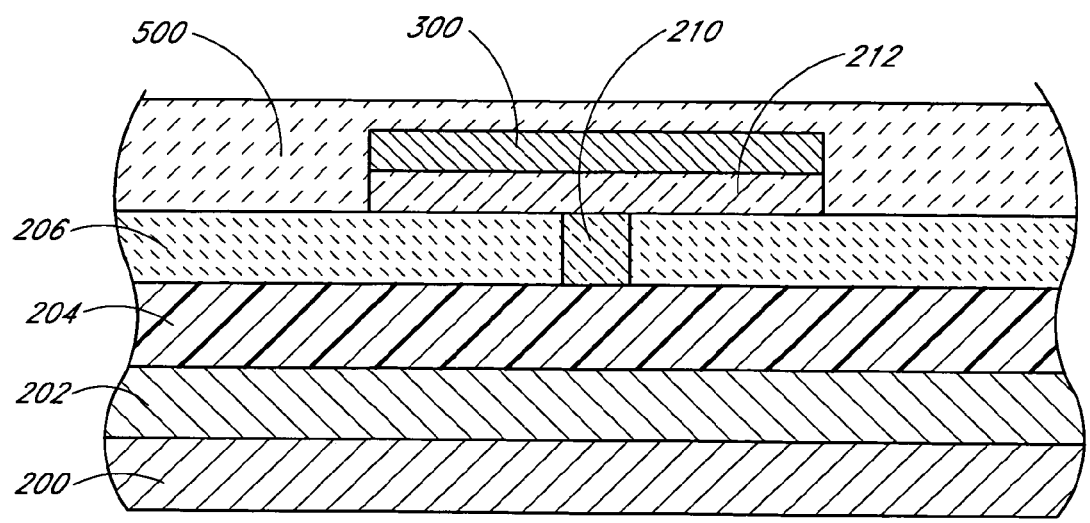
FIG. 5 shows the device of FIG. 4 after a dielectric layer has been formed over the inline pad.

As illustrated in FIG. 5, a dielectric layer 500 is then deposited above the pad 400. The dielectric layer 500 preferably comprises silicon oxide. In one embodiment, the silicon oxide is formed by reaction between silane and nitrous oxide or oxygen and is between about 0.5 and 1 micron thick.

In other embodiments, the dielectric layer 500 may comprise tetraethyl orthosilicate (TEOS), boron phosphosilicate glass (BPSG) or the like. The skilled artisan will understand, however, that a variety of materials can be used for the dielectric layer 500.

Figure 6:
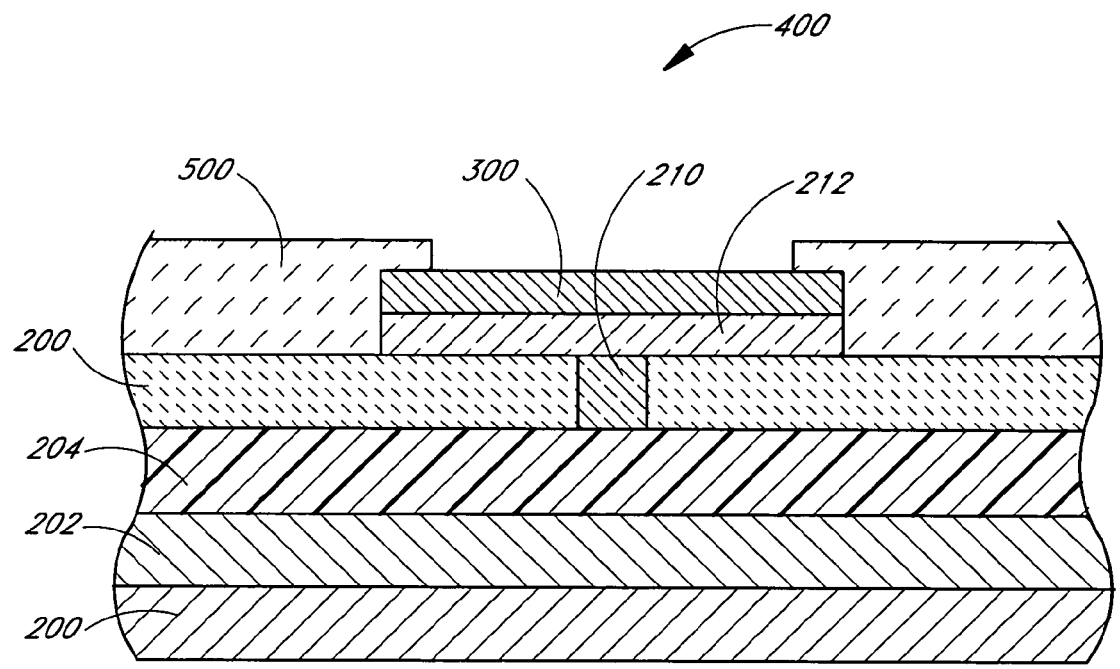
FIG. 6 shows the devise of FIG. 5 after the dielectric layer has been etched to expose a portion of the inline pad.

As illustrated in FIG. 6, the dielectric layer 500 is then etched to expose the surface of the $TiB_xN_y$ layer 300 in the inline pad 400. The etch process can be performed in a variety of conventional manners. Exposing the inline pad 400 allows a probe 104 to be placed in contact with the inline pad 400. The probe 104 can then perform tests as described above.

Figure 7:
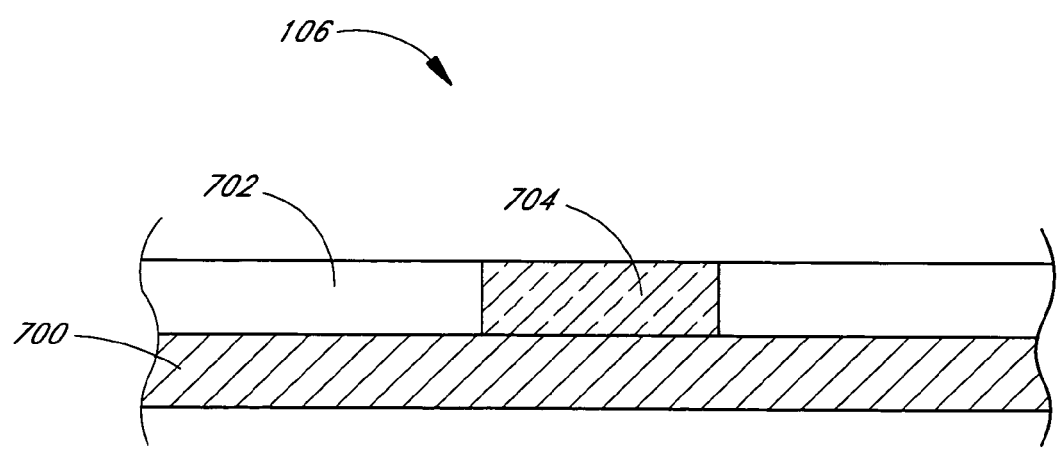
FIG. 7 is a schematic cross-section of a semiconductor device, showing a backend probe pad, in accordance with another embodiment of the present invention.

FIG. 7 illustrates another embodiment of device 106. The device 106 includes a substrate 700, a dielectric layer 702, and a pad 704. In this embodiment, the pad 704 is used during different phases of the backend processing of the device 106. For example, a manufacturer often performs tests after dicing a wafer, wire bonding, packaging, burn-in and the like. The skilled artisan will recognize, however, that the structure of the pad 704 can be adapted for a wide variety of testing situations and is not limited to backend testing.

The substrate 700 comprises semiconductor layers that include active or operable portions of semiconductor devices such a dynamic random access memory, static memory, materials for use in flat panel displays, processors, control circuitry, electronic circuitry and the like. One of skill in the art will recognize, however, that the substrate 700 may comprise an intrinsically doped monocrystalline silicon layer, an epitaxially deposited layer of single-crystal silicon or other forms of materials.

The dielectric layer 702 is deposited above the substrate 700. The dielectric layer 702 preferably comprises silicon oxide. In one embodiment, the silicon oxide is formed by reaction between silane and nitrous oxide or oxygen and is between 0.5 and 1 micron thick.

In other embodiments, the dielectric layer 702 may comprise tetraethyl orthosilicate (TEOS), boron phosphosilicate glass (BPSG) or the like. The skilled artisan will understand, however, that a variety of materials can be used for the dielectric layer 702.

As shown in FIG. 7, a via is etched through the dielectric layer 702 to the substrate 700. The etch process can be performed using a variety of conventional techniques. In one embodiment, the etch process comprises a plasma etch such as a reactive ion etch (RIE). After the via is etched, it is at least partially filled with a $TiB_xN_y$ layer 300.

As discussed above, the $TiB_xN_y$ layer 300 can be formed by reactively sputtering a titanium boride target in a nitrogen-containing ambient. Alternatively, the $TiB_xN_y$ layer 300 can be formed using a plasma anneal process. The sputtering method and the plasma anneal method are provided as examples of possible methods that can be employed to form the $TiB_xN_y$ layer 300. Other methods will become apparent to the skilled artisan in light of the present disclosure.

In one embodiment, the $TiB_xN_y$ layer 300 resulting from either process described above or any other suitable process has an x-factor in the range of about 0.1 to 10, and more preferably in the range of about 0.5 to 2. Furthermore, the resulting $TiB_xN_y$ layer 300 has a y-factor in the range of about 0.2 to 5, and more preferably in the range of about 0.2 to 2. The $TiB_xN_y$ layer 300 is then etched using conventional etching techniques to form a pad 704. The selective removal of the $TiB_xN_y$ layer 300 may be accomplished by a conventional wet metal etch or cleaning step. The pad 704 can vary in size to accommodate different test probes. In one embodiment, the pad 704 is between about 1,500 Å and 100 k Å long, between about 1,500 Å and 2,000 Å wide, and between about 2,000 Å and 20,000 Å thick.

Figure 8:
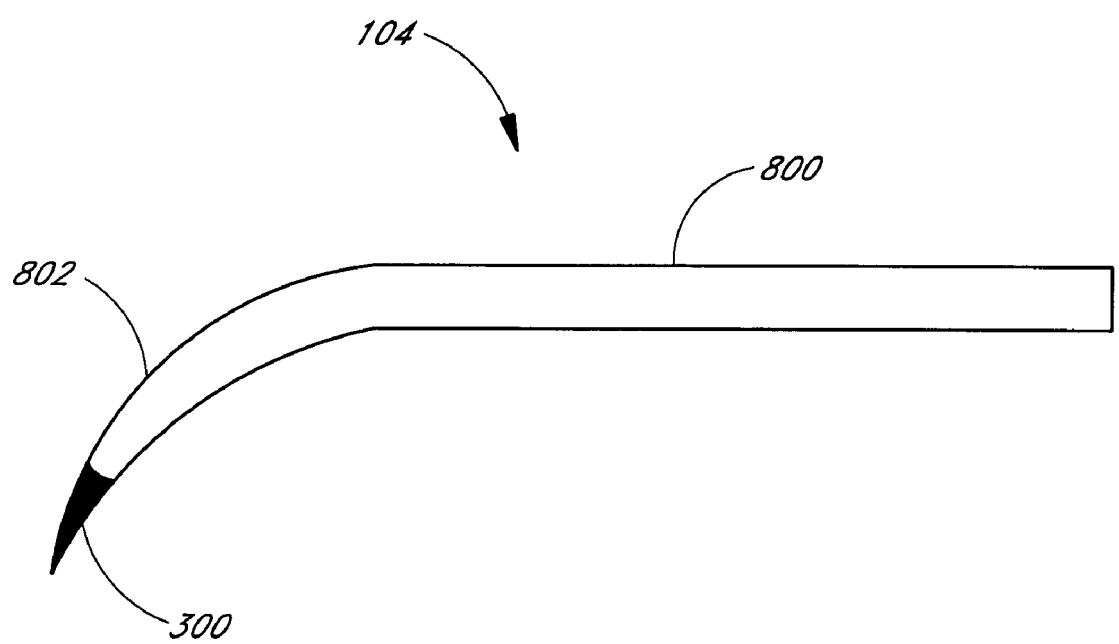
FIG. 8 is a cross-section of one embodiment of a probe.

FIG. 8 illustrates an embodiment of an improved probe 104. The probe 104 includes a needle 800 and a contact 802. While an "L" shaped probe 104 is illustrated in FIG. 8, the skilled artisan will recognize that a wide variety of probe shapes can be used. In the illustrated embodiment, the needle 800 and contact 802 comprise a conductive material suitable for performing tests.

The surface of the contact 802 further comprises a $TiB_xN_y$ layer 300. The $TiB_xN_y$ layer 300 can be adhered to the contact 802 by reactively sputtering a titanium boride target in a nitrogen-containing ambient as discussed above. Alternatively, the $TiB_xN_y$ layer 360 can be formed using a plasma anneal process. Other methods will also become apparent to the skilled artisan in the art in light of the present disclosure.

In another embodiment, the pads 400, 704 described above are coupled to the contact 802 such that the pads 400, 704 become part of the probe 104. The resulting $TiB_xN_y$ layer 300 on the probe 104 has an x-factor in the range of about 0.1 to 10, and more preferably in the range of about 0.5 to 2. Furthermore, the resulting $TiB_xN_y$ layer 300 has a y-factor in the range of about 0.2 to 5, and more preferably in the range of about 0.2 to 2.

The $TiB_xN_y$ layer 300 demonstrates certain advantages over conventional materials. One advantage is that the $TiB_xN_y$ layer 300 is relatively hard. For example, $TiBN_{0.4}$ exhibits a nano-hardness of more than 50 GPa, which is comparable to the hardness of tungsten carbide (WC). By comparison, conventional pads generally exhibit a hardness in the range of about 5 to 20 GPa. Such increased hardness tends to reduce scratching when a probe 104 is placed in contact with the pad 400.

Another advantage of the $TiB_xN_y$ layer 300 is its fine granularity. For example, some embodiments of the $TiB_xN_y$ layer 300 have a grain size of less than about 50 angstroms and in some instances ranges from about 30 to 40 angstroms. In one embodiment, $TiB_{0.4}N_{0.6}$ has a grain size of less than about 30 angstroms peak-to-peak. By comparison, conventional pad materials generally exhibit a grain size in the range of about 200 to 300 angstroms. The chemical composition the $TiB_xN_y$ layer 300 produces a smoother surface on the pad 400. The smoother surface is more resistant to scratching than a rough surface. Thus, when a probe 104 is placed in contact with the pad 400, the fine granularity of the $TiB_xN_y$ layer 300 reduces the likelihood that the $TiB_xN_y$ layer 300 will scratch, break, or chip.

Scratching often releases undesirable flakes, chips, and particles. Because the $TiB_xN_y$ layer 300 is less susceptible to scratching, the $TiB_xN_y$ layer 300 can reduce the amount of contaminants that are released into the fabrication environment.

Furthermore, scratching the surface of test pads or probes can interfere with repeated testing procedures. Accordingly, embodiments of the $TiB_xN_y$ layer 300 can increase the reliability of repeated testing and extend the life of test probes, test pads, and test connections.

In addition, because certain embodiments of the $TiB_xN_y$ layer 300 have fine granularity, the $TiB_xN_y$ layer 300 can be fabricated in thin sheets, thereby reducing the thickness of the pads 400, 704. For example, some embodiments of pads 400, 704 have a thickness in the range of about 100 to 200 angstroms (Å). By comparison, conventional pads generally have a thickness in the range of about 500 angstroms. The $TiB_xN_y$ layer 300 can also be used to construct thinner probe surfaces.

Another advantage is that embodiments of the $TiB_xN_y$ layer 300 are thermally stable at high temperatures. The thermal stability of the $TiB_xN_y$ layer 300 allows the $TiB_xN_y$ layer 300 to be used in devices that are manufactured at high temperatures or are subject to high temperatures. For example, embodiments of the $TiB_xN_y$ layer 300 exhibit thermal stability up to approximately 1,500 degrees centigrade.

Yet another advantage is that embodiments of the $TiB_xN_y$ layer 300 adhere well to metal layers and silicon substrates. Because the $TiB_xN_y$ layer 300 adheres well to other semiconductor substances, it can be applied without using expensive adhesives, thereby reducing the complexity and expense of applying the $TiB_xN_y$ layer 300.

An additional advantage is that the $TiB_xN_y$ layer 300 may exhibit a bulk resistivity comparable to that of conventional pad materials. The relatively low bulk resistivity of the $TiB_xN_y$ layer 300 provides a good conductive surface for the pads 400, 704 and probe contacts 802. For example, the $TiB_xN_y$ layer 300 generally exhibits a bulk resistivity ranging from about 40 to 300 microohms centimeter (μΩcm). In one embodiment, $TiBN_{0.4}$ has a bulk resistivity of less than about 100 μΩcm. Furthermore, titanium nitride (TiN), a conventional pad material, generally exhibits a bulk resistivity ranging from about 200 to 300μΩcm.

These advantages, either individually or in combination, reduce scratching, reduce cost, decrease size, decrease contamination or improve reliability. Although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by reference to the appended claims.

What is claimed is:

1. A semiconductor structure comprising a pad with a $TiB_xN_y$ conductor wherein the $TiB_xN_y$ conductor conducts electrical signals.

2. The semiconductor structure of claim 1 wherein the $TiB_xN_y$ conductor conducts electrical signals between the semiconductor structure and test circuitry.

3. The semiconductor structure of claim 1 wherein the $TiB_xN_y$ conductor is a contact point.

4. The semiconductor structure of claim 1 wherein the $TiB_xN_y$ conductor is a test pad.

5. The semiconductor structure of claim 1 wherein the $TiB_xN_y$ conductor forms a portion of a semiconductor memory.

6. The semiconductor structure of claim 1 wherein the $TiB_xN_y$ conductor forms a portion of a processor.

7. The semiconductor structure of claim 6 wherein the processor is in communication with at least one peripheral.

8. The semiconductor structure of claim 1 wherein the semiconductor structure further comprises digital signal processing circuitry wherein the $TiB_xN_y$ conductor is in communication with the digital signal processing circuitry.

9. The semiconductor structure of claim 1 further comprising a substrate wherein the $TiB_xN_y$ conductor is layered on the substrate.

10. The semiconductor structure of claim 2 wherein the test circuitry is used during inline testing.

11. The semiconductor structure of claim 2 wherein the test circuitry is used during backend testing.

12. A semiconductor structure comprising a $TiB_xN_y$ conductor wherein the $TiB_xN_y$ conductor conducts electrical signals.

13. The semiconductor structure of claim 12 wherein the $TiB_xN_y$ conductor conducts electrical signals between the semiconductor structure and test circuitry.

14. The semiconductor structure of claim 12 wherein the $TiB_xN_y$ conductor is a contact point.

15. The semiconductor structure of claim 12 wherein the $TiB_xN_y$ conductor is a test pad.

16. The semiconductor structure of claim 12 wherein the $TiB_xN_y$ conductor forms a portion of a semiconductor memory.

17. The semiconductor structure of claim 12 wherein the $TiB_xN_y$ conductor forms a portion of a processor.

18. The semiconductor structure of claim 17 wherein the processor is in communication with at least one peripheral.

19. The semiconductor structure of claim 12 wherein the semiconductor structure further comprises digital signal processing circuitry wherein the $TiB_xN_y$ conductor is in communication with the digital signal processing circuitry.

20. The semiconductor structure of claim 12 further comprising a substrate wherein the $TiB_xN_y$ conductor is layered on the substrate.

* * * * *

UNITED STATES PATENT AND TRADEMARK OFFICE
CERTIFICATE OF CORRECTION

PATENT NO. : 7,046,029 B2 Page 1 of 1
APPLICATION NO. : 11/108603
DATED : May 16, 2006
INVENTOR(S) : Yungjun Jeff Hu It is certified that error appears in the above-identified patent and that said Letters Patent is hereby corrected as shown below:

Title page, item 56 at column 2 (other publications), line 3, please delete "Absorbtion" and insert -- Absorption --, therefore.

Column 2, line 61(Approx.), please delete "devise" and insert -- device --, therefor.

Column 4, line 28, please delete "suicides" and insert -- silicides --, therefor.

Column 7, line 61, please delete "360" and insert -- 300 --, therefor.

Column 8, line 22, after "position" please insert -- of --.

Signed and Sealed this

Sixteenth Day of January, 2007

JON W. DUDAS
*Director of the United States Patent and Trademark Office*